(12) United States Patent
Choi et al.

(10) Patent No.: US 8,309,008 B2
(45) Date of Patent: Nov. 13, 2012

(54) SEPARATION IN AN IMPRINT LITHOGRAPHY PROCESS

(75) Inventors: Byung-Jin Choi, Austin, TX (US); Mahadevan Ganapathisubramanian, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 274 days.

(21) Appl. No.: 12/603,270

(22) Filed: Oct. 21, 2009

(65) Prior Publication Data

US 2010/0110409 A1    May 6, 2010

Related U.S. Application Data

(60) Provisional application No. 61/109,557, filed on Oct. 30, 2008.

(51) Int. Cl.
*B29C 33/44* (2006.01)
*B29C 41/12* (2006.01)
*B81C 1/00* (2006.01)

(52) U.S. Cl. ........................................ 264/319; 264/335

(58) Field of Classification Search .................. 427/162; 264/319, 334, 335
See application file for complete search history.

(56) References Cited

U.S. PATENT DOCUMENTS

| | | | |
|---|---|---|---|
| 7,060,402 B2 | 6/2006 | Choi et al. |
| 7,150,622 B2 | 12/2006 | Choi et al. |
| 7,157,036 B2 | 1/2007 | Choi et al. |
| 7,179,079 B2 | 2/2007 | Sreenivasan et al. |
| 7,245,358 B2 | 7/2007 | Nimmakayala et al. |
| 7,259,833 B2 | 8/2007 | Nimmakayala et al. |
| 7,307,697 B2 | 12/2007 | GanapathiSubramanian et al. |
| 7,396,475 B2 | 7/2008 | Sreenivasan |
| 7,504,268 B2 | 3/2009 | GanapathiSubramanian et al. |
| 7,635,263 B2 | 12/2009 | Cherala et al. |
| 7,635,445 B2 | 12/2009 | Choi et al. |
| 7,636,999 B2 | 12/2009 | Choi et al. |
| 7,641,840 B2 | 1/2010 | Choi et al. |
| 7,670,529 B2 | 3/2010 | Choi et al. |
| 7,670,530 B2 | 3/2010 | Choi et al. |
| 2004/0168613 A1 | 9/2004 | Nguyen et al. |
| 2006/0145398 A1 | 7/2006 | Bailey et al. |
| 2006/0172031 A1 | 8/2006 | Babbs et al. |
| 2007/0035717 A1 | 2/2007 | Wu et al. |
| 2007/0126156 A1 | 6/2007 | Ganapathisubramanian et al. |
| 2007/0145639 A1* | 6/2007 | Seki et al. ..................... 264/293 |

(Continued)

FOREIGN PATENT DOCUMENTS

EP      1795959 A1    6/2007

(Continued)

OTHER PUBLICATIONS

Sohn et al., Nanoimprinting of thin polymer films using elementwise patterned stamp and subsequent application of pressurized air, Japanese Joournal of Applied Physics, Japan Society of Applied Physics, Tokyo, JP vol. 45, No. 7, pp. 5902-2905 Jul. 1, 2006.

*Primary Examiner* — Leo B Tentoni
(74) *Attorney, Agent, or Firm* — Cameron A. King

(57) ABSTRACT

Systems, methods, and processes for separating a template from a substrate retained on an air cavity chuck during an imprint lithography process. Generally, vacuum level provided by air cavity chuck may be controlled during conforming of polymerizable material between the template and the substrate and during separation of the template and the substrate.

19 Claims, 6 Drawing Sheets

U.S. PATENT DOCUMENTS

| | | |
|---|---|---|
| 2007/0164487 A1 | 7/2007 | Beck et al. |
| 2007/0231422 A1 | 10/2007 | Cherala et al. |
| 2007/0287081 A1 | 12/2007 | Cherala et al. |
| 2008/0093339 A1 | 4/2008 | Kasumi et al. |
| 2008/0204693 A1 | 8/2008 | Nimmakayala et al. |

FOREIGN PATENT DOCUMENTS

| | | |
|---|---|---|
| EP | 1844830 A1 | 2/2008 |
| WO | WO 01/42858 A1 | 6/2001 |
| WO | WO 2004/044651 | 5/2004 |
| WO | WO 2007/136832 | 11/2007 |

* cited by examiner

SEPARATION IN AN IMPRINT LITHOGRAPHY PROCESS

CROSS-REFERENCE TO RELATED APPLICATIONS

This application claims the benefit under 35 U.S.C. §119(e)(1) of U.S. Provisional Patent Application No. 61/109,557, filed Oct. 30, 2008, which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a polymerizable layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
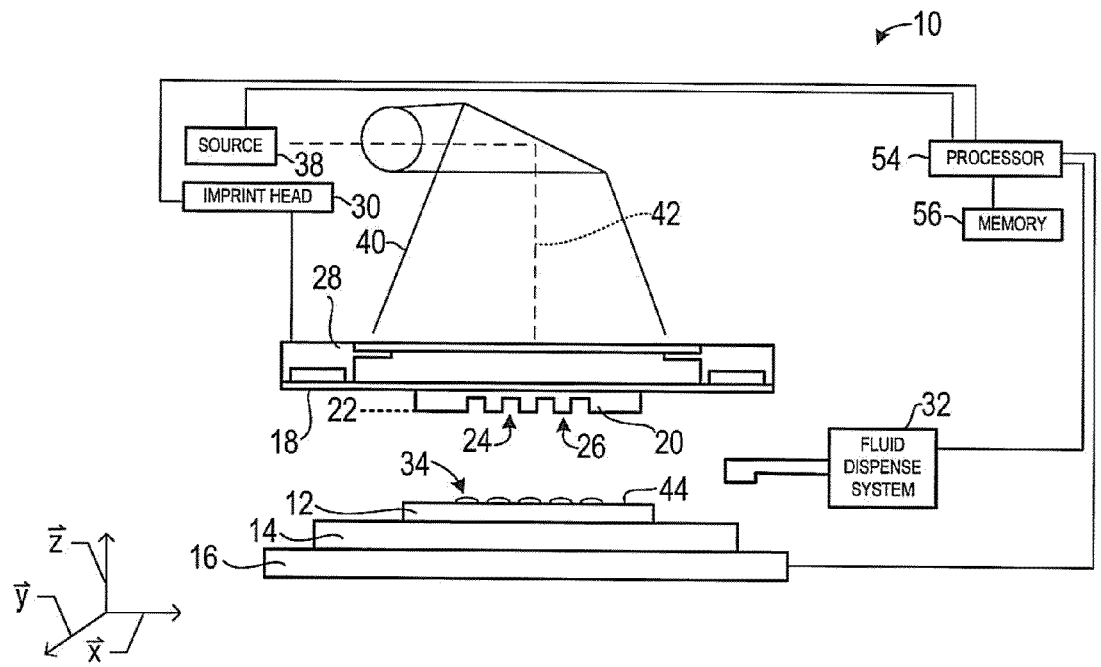
FIG. 1 illustrates a simplified side view of one embodiment of a lithographic system in accordance with the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer as described in U.S. Pat. No. 7,157,036 and U.S. Patent Publication No. 2005/0187339, all of which are hereby incorporated by reference.

Figure 2:
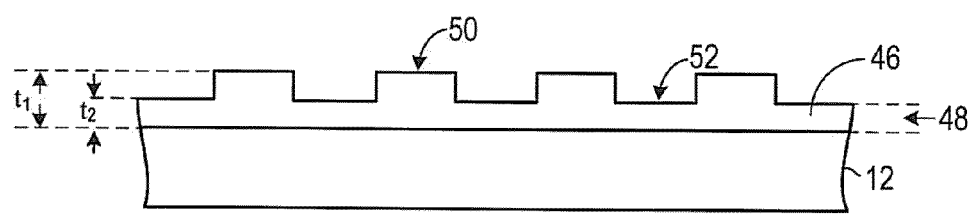
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

When using a pin-type chuck for substrate chuck 14, minimal shearing of features 50 and/or 52 occurs in the radial direction. When using an air cavity chuck as chuck 14, however, shearing of features 50 and/or 52 has been observed. Currently, within the art, there are two separate process flows for using a pin-type chuck versus using an air cavity chuck as chuck 14.

Figure 3:
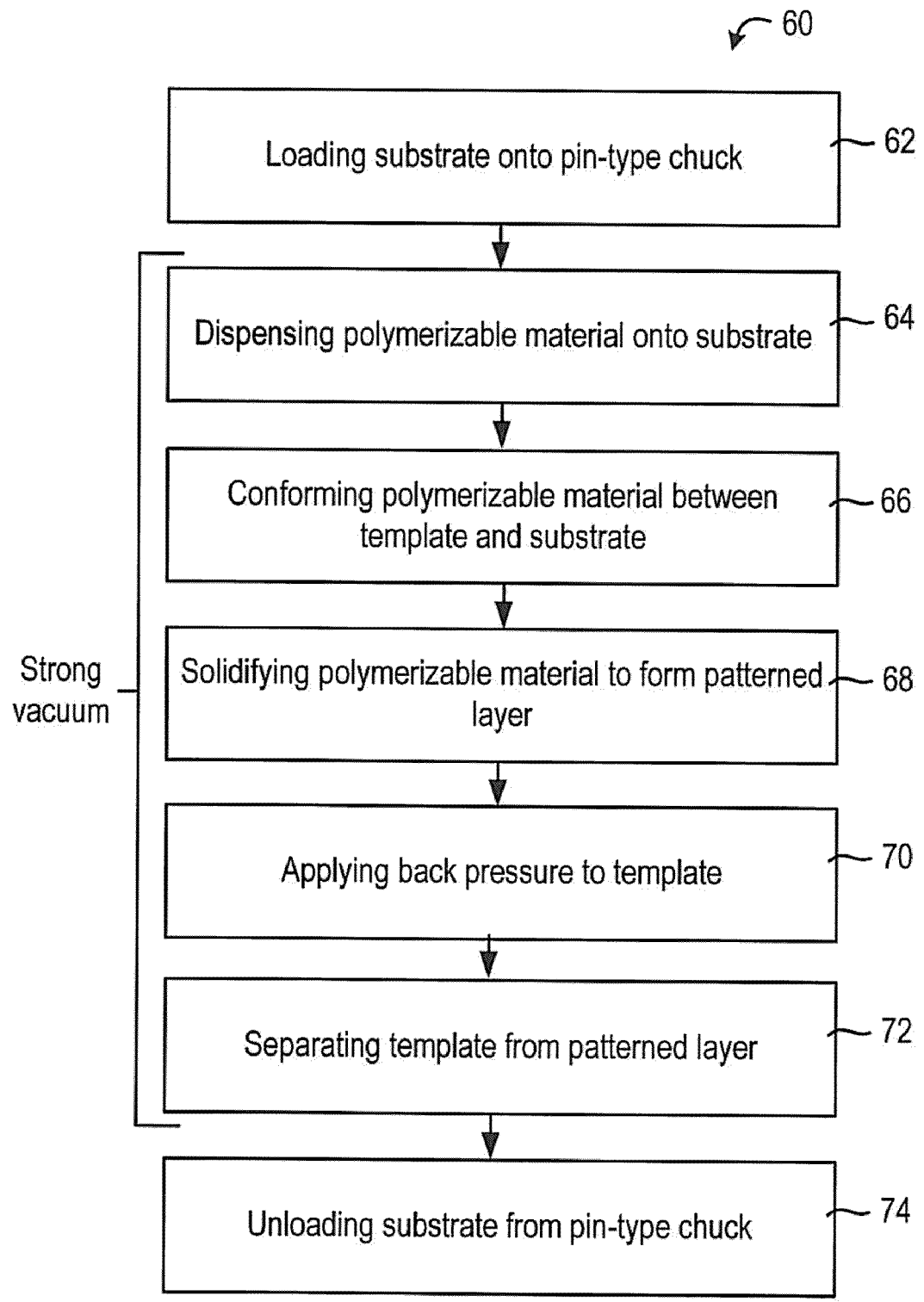
FIG. 3 illustrates a prior art method of imprinting using a pin type chuck in the system shown in FIG. 1.
Figure 4A:
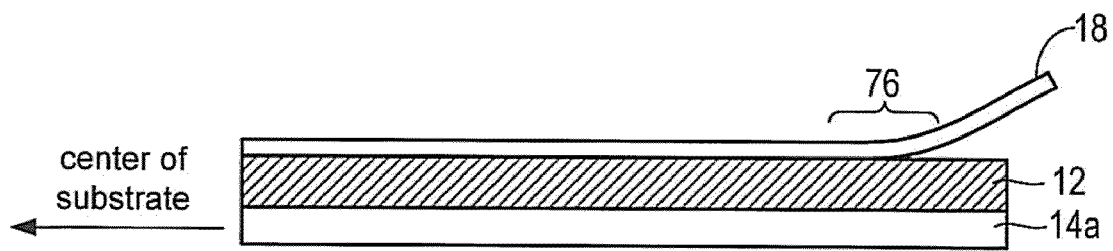
FIGS. 4A and 4B illustrate the pin type chuck of FIG. 3.
Figure 4B:
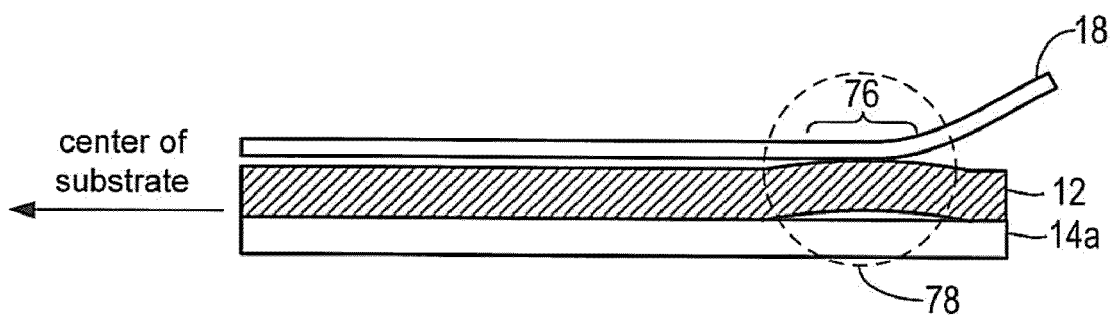

FIG. 3 illustrates an exemplary process flow 60 for a pin-type chuck 14a illustrated in FIGS. 4A and 4B. Generally, during a first step 62, substrate 12 may be loaded onto pin-type chuck 14a. In a second step 64, polymerizable material 34 may be dispensed on substrate 12. In a third step 66, template 18 may contact polymerizable material 34 conforming polymerizable material 34 between template 18 and substrate 12. In a fourth step 68, polymerizable material 34 may be solidified forming patterned layer 46. In a fifth step 70, back pressure may be applied to template 18. In a sixth step 72, template 18 may be separated from patterned layer 46 (i.e., patterned layer 46 positioned on substrate 12). In a seventh step 74, substrate 12 may be unloaded from pin-type chuck. During the process flow 60 for pin-type chuck 14a, pin-type chuck 14a generally may maintain a strong vacuum during steps 64 to 72. For example, pin-type chuck 14a may maintain approximately 80 kPa.

During separation of substrate 12 (including patterned layer 46) from template 18 as described in process flow 60, pin type chuck 14a may maintain substrate 12 in a substantially planar shape. Referring to FIGS. 4A and 4B, at a separation front 76 (i.e., where crack forms between substrate 12 and template 18), bending shapes and/or magnitudes for template 18 and/or substrate 12 may depend on bending stiffness, vacuum pressure, and the like when using pin-type chuck 14a. For example, FIG. 4A illustrates separation of substrate 12 and template 18 under high vacuum pressure and high mechanical stiffness of substrate 12. In this situation, bending may be minimal. Alternatively, FIG. 4B illustrates separation of substrate 12 and template 18 when vacuum pressure and/or mechanical stiffness of substrate 12 are not strong enough. In this situation, a localized deformation 78 in substrate 12 may occur at separation front 76. This localized deformation 78 may result from localized bending of substrate 12. In both situations (i.e., FIGS. 4A and 4B), however, only minimal shearing motion exists at separation front 76 resulting in minimal separation defects.

Figure 5:
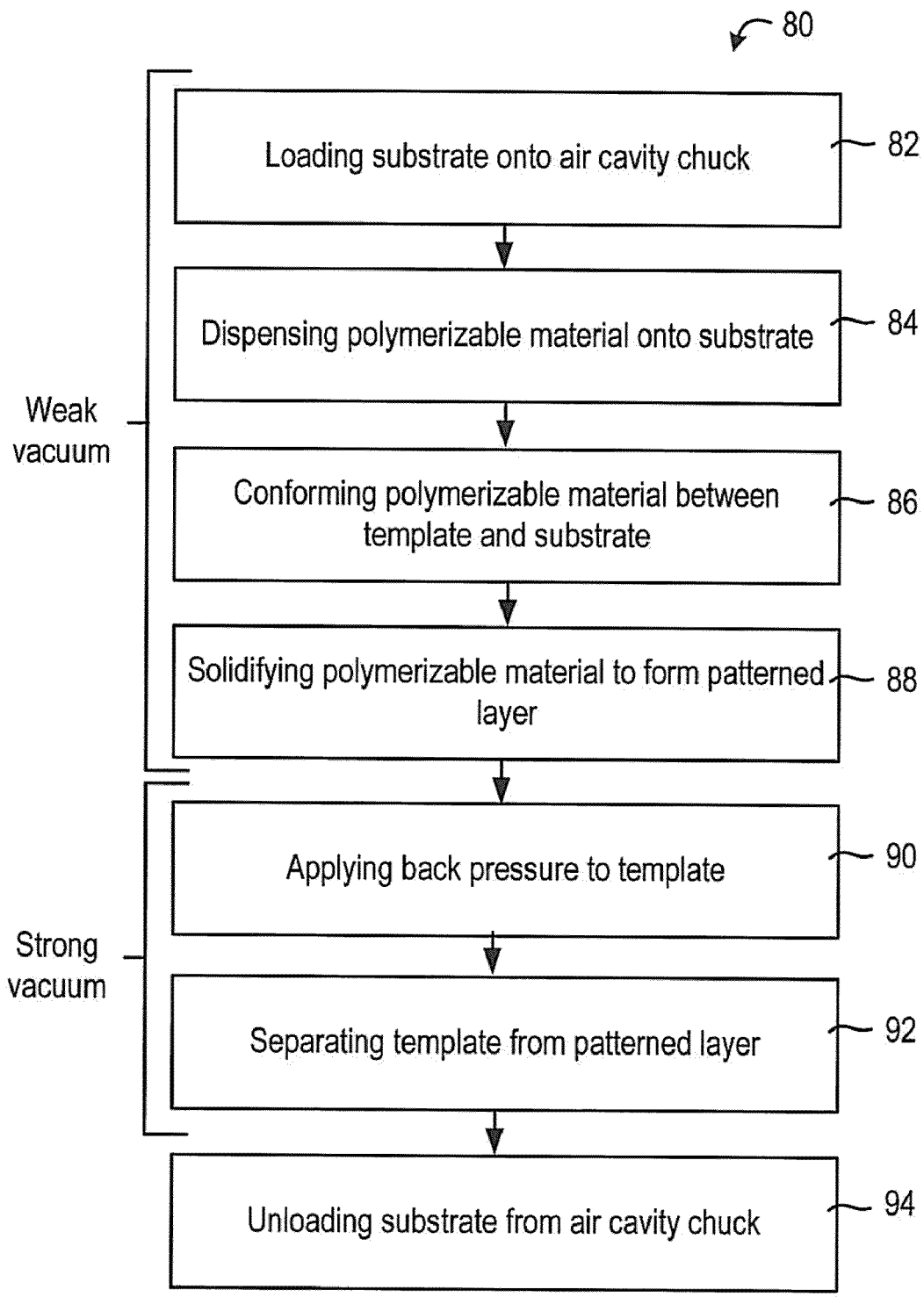
FIG. 5 illustrates a prior art method of imprinting using an air cavity chuck in the system shown in FIG. 1.
Figure 6A:
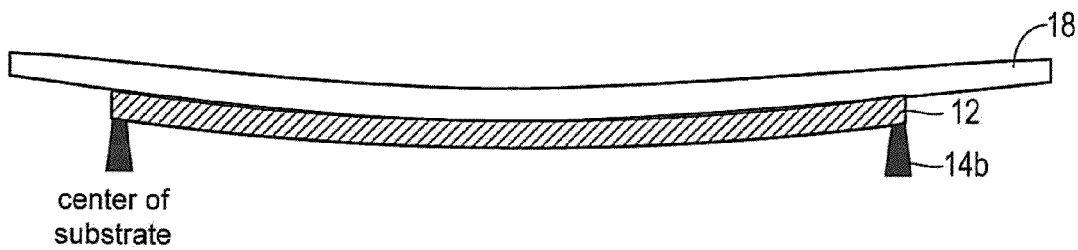
FIGS. 6A 6B, and 6C illustrate the air cavity chuck of FIG. 5.
Figure 6B:
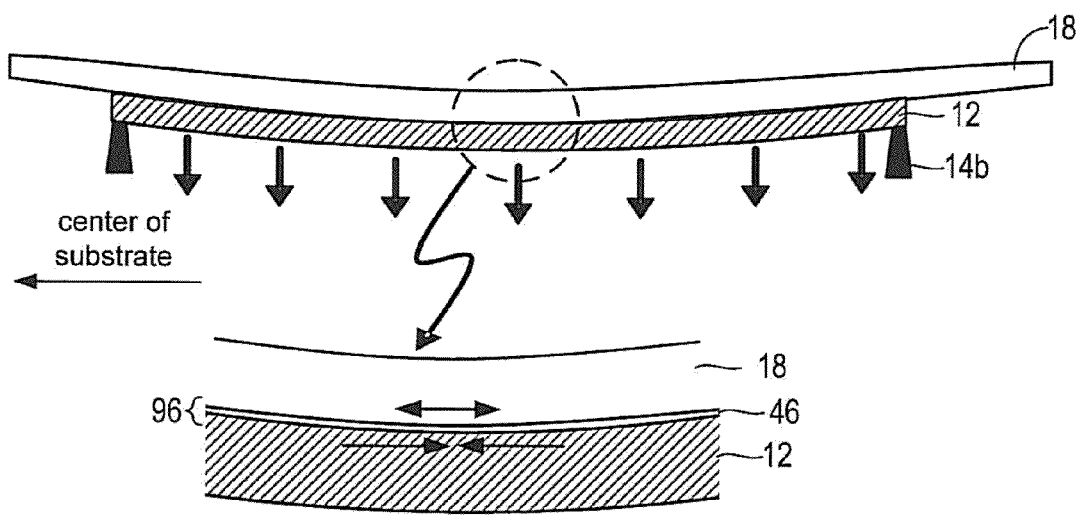
Figure 6C:
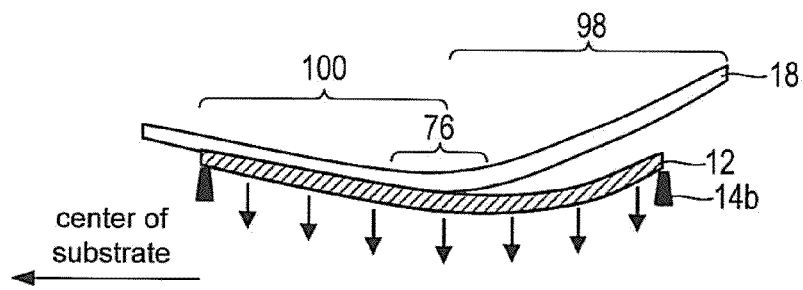
Figure 7:
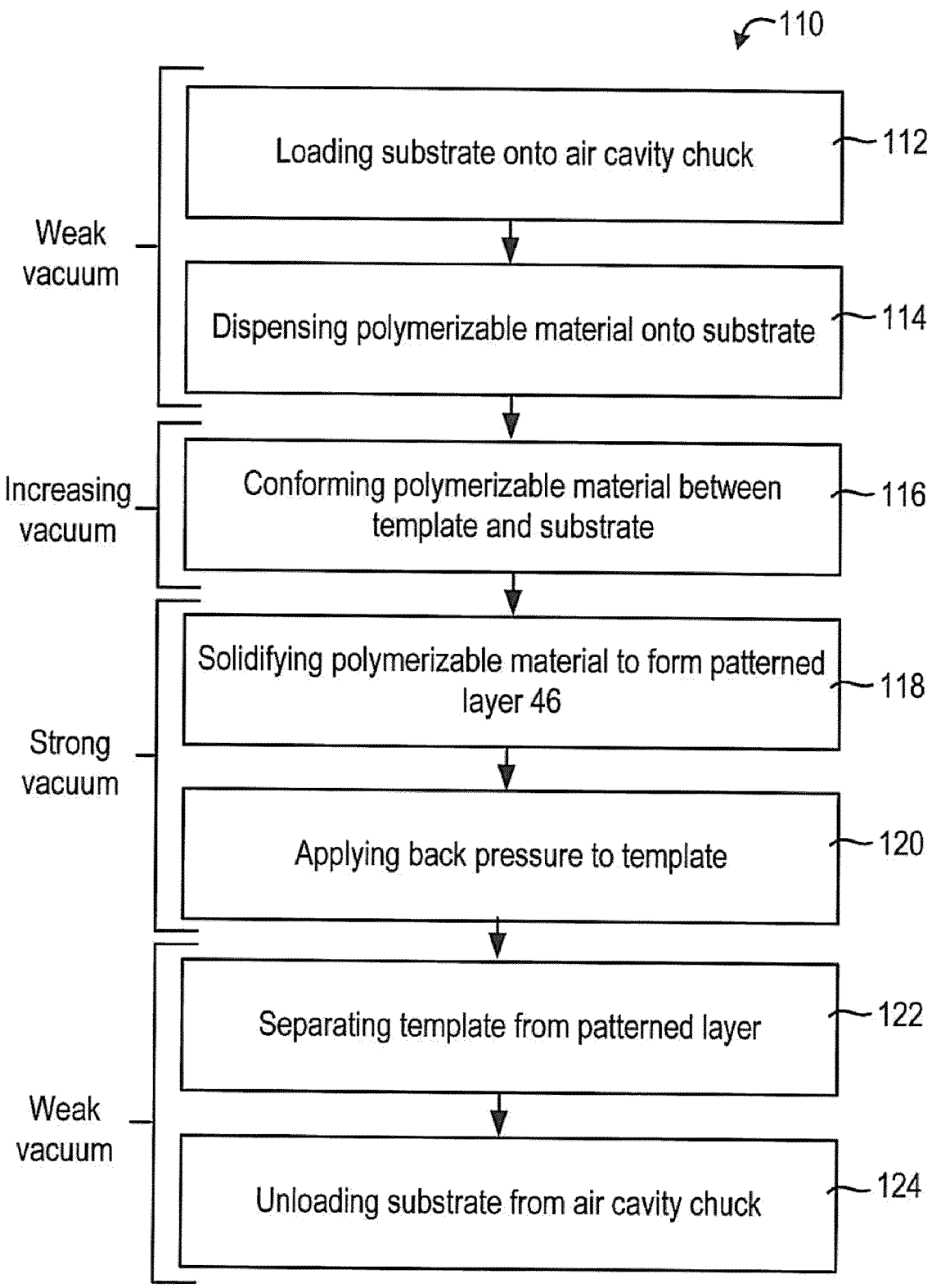
FIG. 7 illustrates an exemplary method of imprinting using an air cavity chuck in the system shown in FIG. 1, wherein shear stress on a patterned layer is minimized.

FIG. 5 illustrates an exemplary process flow 80 for an air cavity chuck 14b illustrated in FIGS. 6 and 7. Generally, during a first step 82, substrate 12 may be loaded onto air cavity chuck 14b. In a second step 84, polymerizable material 34 may be deposited on substrate 12. In a third step 86, template 18 may contact polymerizable material 34 conforming polymerizable material 34 between template 18 and substrate 12. In a fourth step 88, polymerizable material 34 may be solidified forming patterned layer 46. In a fifth step 90, back pressure may be applied to template 18. In a sixth step 92, template may be separated from patterned layer 46. In a seventh step 94, substrate 12 may be unloaded from air cavity chuck 14b. During the process flow 90 for air cavity chuck 14b, air cavity chuck 14b initially provides a weak vacuum pressure during steps 82 to 88 and provides a strong vacuum pressure during steps 90-92. For example, during steps 82 to 88, vacuum pressure may be maintained at approximately −5 kPa to −10 Kpa, and during steps 90-92 vacuum pressure may be maintained at approximately −40 kPa to full vacuum.

As illustrated in FIG. 6A, during imprinting using the air-cavity chuck, substrate 12 may generally be held using a weak vacuum force (e.g., −5 kPa to −10 kPa) such that a portion of substrate 12 bows toward air-cavity chuck 14b. By bowing the portion of the substrate 12 toward air-cavity chuck 14b, polymerizable material 34 may conform between template 18 and substrate 12. Once solidification of polymerizable material 34 has occurred, substrate 12 generally needs to be secured to air-cavity chuck 14b during separation of substrate 12 and template 18 to avoid detachment of substrate 12 from surface of air-cavity chuck 14b. However, since bending magnitude may be significantly increased after solidification of polymerizable material 34, a significant shear stress may be applied at interface 96 of template 18 and substrate 12 where a relatively soft patterned layer 46 exists as illustrated in FIG. 6B. Further, as separation front 76 progresses, portions 98 of substrate 12 separated from template 18 may begin bending aggressively under high vacuum pressure applied by air-cavity chuck 14b needed to secure un-separated portions 100 of substrate 12 as shown in FIG. 6C.

FIG. 7 illustrates an exemplary method 110 for retaining substrate 12 on air-cavity chuck 14 while minimizing shear stress on patterned layer 46. In general, bending shape of substrate 12 during solidification of polymerizable material 34 and bending shape of substrate 12 during separation of substrate 12 may be substantially similar. Additionally, high vacuum pressure (e.g., −40 kPa to full vacuum pressure (e.g., −120 kPa)) may be maintained only at early stages of separation and/or may be based on location of separation front 76. As separation front 76 progresses, vacuum pressure may be lowered minimizing bending of substrate 12. By minimizing bending of substrate 12, shearing of features 50 and 52 of patterned layer 46 may be substantially minimized or eliminated.

Generally, during a first step 112, substrate 12 may be loaded onto air cavity chuck 14b. A weak vacuum pressure (e.g., −5 kPa to −10 kpa) may be applied by air cavity chuck 14b during loading of substrate 12. In a second step 114, polymerizable material 34 may be deposited on substrate 12. During deposition of polymerizable material 34, air cavity chuck 14b may maintain the weak vacuum pressure. In a third step 116, template 18 may contact polymerizable material 34 conforming polymerizable material 34 between template 18 and substrate 12. During conforming of polymerizable material 34, air cavity chuck 14b may maintain the weak vacuum pressure and increase vacuum pressure to about the vacuum level required to hold the substrate during the initial separation (in the range of −40 kPa to full vacuum pressure (e.g., −120 kPa). In a fourth step 118, polymerizable material 34 may be solidified forming patterned layer 46. During solidification of polymerizable material 34, air cavity chuck 14b may maintain the strong vacuum pressure. In a fifth step 120, back pressure may be applied to template 18. During application of back pressure, air cavity chuck 14b may maintain the strong vacuum pressure. In a sixth step 122, template 18 may be separated from patterned layer 46. During separation of template 18 from patterned layer 46, air cavity chuck 14b may initially provide the strong vacuum pressure. Vacuum pressure may be reduced as separation front 76 moves from an edge of substrate 12 towards a center of substrate 12. In one embodiment, vacuum pressure may be controlled as separation front 76 progresses based on separation images and/or estimations. For example, images (e.g., photo) of separation front may be provided and evaluated to provide an estimation of separation front 76 and/or visual shape of substrate 12. Based on estimation of separation front 76 and/or visual shape of substrate 12, vacuum level may be adjusted. In a seventh step 94, substrate 12 may be unloaded from air cavity chuck 14b.

What is claimed is:

1. A method for retaining a substrate on an air cavity chuck, comprising:
    loading the substrate onto the air cavity chuck, the air cavity chuck providing a first vacuum pressure on the substrate;
    depositing polymerizable material onto the substrate, the air cavity chuck maintaining the first vacuum pressure on the substrate;
    conforming the polymerizable material between an imprint lithography template and the substrate, with the air cavity chuck increasing vacuum pressure on the substrate from the first vacuum pressure to a second vacuum pressure greater than the first vacuum pressure;
    solidifying the polymerizable material forming a patterned layer, with the air cavity chuck maintaining the second vacuum pressure on the substrate; and,
    separating the template from the patterned layer, with the air cavity chuck reducing the second vacuum pressure to the first vacuum pressure as a separation front moves from an edge of the substrate to a center of the substrate.

2. The method of claim 1, further comprising applying back pressure to the template while the air cavity chuck maintains the second vacuum pressure.

3. The method of claim 1, further comprising unloading the substrate from the air cavity chuck.

4. The method of claim 1, wherein the first vacuum pressure is within a range of approximately −5 kPa to −20 kPa.

5. The method of claim 1, wherein the second vacuum pressure is within a range of approximately −40 kPa to full vacuum pressure.

6. The method of claim 1, further comprising providing images of separation front; and, adjusting the second vacuum pressure based on the images.

7. The method of claim 6, wherein the images provide visual shape of the substrate along the separation front and adjusting the second vacuum pressure includes evaluating the visual shape.

8. The method of claim 1, wherein separating the template from the patterned layer includes applying the second vacuum pressure at initiation of the separation front.

9. The method of claim 1, wherein the first vacuum pressure is increased prior to solidification of the polymerizable material.

10. The method of claim 1, wherein the first vacuum pressure is increased prior to initial solidification of the polymerizable material.

11. The method of claim 1, wherein the second vacuum pressure is adapted to minimize shearing of patterned layer features.

12. The method of claim 1, wherein the first vacuum pressure is adapted to minimize shearing of patterned layer features.

13. The method of claim 1, wherein increase of the first vacuum pressure to the second vacuum pressure is adapted to minimize shearing of patterned layer features during separation.

14. The method of claim 1, wherein reduction of the first vacuum pressure to the second vacuum pressure is adapted to minimize shearing of patterned layer features during separation.

15. A method of forming a patterned layer on a substrate using an imprint lithography template, comprising:
    conforming polymerizable material between the template and the substrate, the substrate retained by an air cavity chuck;
    solidifying the polymerizable material to form the patterned layer; and,
    separating the template from the patterned layer;
    wherein the air cavity chuck applies a first vacuum pressure to the substrate during conforming of the polymerizable material and applies a second vacuum pressure to the substrate during solidification of the polymerizable material, wherein the first vacuum pressure is substantially less than the second vacuum pressure.

16. The method of claim 15, wherein the first vacuum pressure is within a range of approximately −5 kPa to −10 kPa.

17. The method of claim 15, wherein the second vacuum pressure is within a range of approximately −40 kPa to full vacuum pressure.

18. The method of claim 15, wherein the first vacuum pressure and the second vacuum pressure are adapted to minimize shearing of patterned layer features.

19. A method of forming a patterned layer on a substrate using an imprint lithography template, comprising:
    conforming polymerizable material between the template and the substrate, the substrate retained by an air cavity chuck at a first vacuum pressure;
    solidifying the polymerizable material to form the patterned layer, the substrate retained by the air cavity chuck at a second vacuum pressure greater than the first vacuum pressure; and,
    separating the template from the patterned layer wherein during separation, the air cavity chuck retains the substrate initially at the second vacuum pressure and reduces the second vacuum pressure to the first pressure, the reduction adapted to minimize shearing of patterned layer.

* * * * *